United States Patent
Ko et al.

(10) Patent No.: US 7,624,498 B2
(45) Date of Patent: Dec. 1, 2009

(54) APPARATUS FOR DETACHING A SEMICONDUCTOR CHIP FROM A TAPE

(75) Inventors: Youn-sung Ko, Cheonan-si (KR);
Hak-kyoon Byun, Asan-si (KR);
Jung-hwan Woo, Cheonan-si (KR);
Hyun-jung Song, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/755,170

(22) Filed: May 30, 2007

(65) Prior Publication Data
US 2007/0293022 A1  Dec. 20, 2007

(30) Foreign Application Priority Data
Jun. 19, 2006  (KR) .................... 10-2006-0054922

(51) Int. Cl.
*B23P 19/00* (2006.01)
*H01L 21/00* (2006.01)

(52) U.S. Cl. .............. 29/742; 29/426.1; 29/426.3; 29/721; 29/762; 438/464

(58) Field of Classification Search ............ 29/762, 29/721, 426.1, 426.3, 832, 760, 742; 439/247, 439/620.28, 620.34, 929; 438/464, 460, 438/462; 156/344, 584; 414/540, 546, 553, 414/559
See application file for complete search history.

(56) References Cited

U.S. PATENT DOCUMENTS

| | | | | |
|---|---|---|---|---|
| 4,850,780 A | * | 7/1989 | Safabakhsh et al. | 414/416.1 |
| 5,589,029 A | * | 12/1996 | Matsui et al. | 156/344 |
| 6,202,292 B1 | * | 3/2001 | Farnworth et al. | 29/743 |
| 6,629,553 B2 | * | 10/2003 | Odashima et al. | 156/584 |
| 2005/0274457 A1 | | 12/2005 | Cheung et al. | |

FOREIGN PATENT DOCUMENTS

JP  2003-124290  4/2003
KR  1020050111946 A  11/2005

* cited by examiner

*Primary Examiner*—Derris H Banks
*Assistant Examiner*—Tai Nguyen
(74) *Attorney, Agent, or Firm*—Volentine & Whitt, PLLC (57) ABSTRACT

An apparatus for and a method of detaching a semiconductor chip from a tape minimize the likelihood that the semiconductor chip will crack. The apparatus includes a holder, a first ejector having an upper end, and a second ejector whose upper end is disposed centrally of that of the first ejector. The holder has an upper portion and a through-hole extending through the upper portion. The ejectors have upper ends that are extendable and retractable out of and back into the holder via the through-hole in the upper portion of the holder. A tape to which at least one semiconductor chip is attached is set against the upper portion of the holder. The first ejector is extended a first distance from the holder to push the semiconductor chip upward. The second ejector is extended from the holder by a second distance larger than the first distance so as to push the semiconductor chip further upward. Thus, the tape is progressively detached from the semiconductor chip.

18 Claims, 9 Drawing Sheets

APPARATUS FOR DETACHING A SEMICONDUCTOR CHIP FROM A TAPE

BACKGROUND OF THE INVENTION

1. Field of the Invention

The present invention relates to an apparatus for and to a method of assembling a semiconductor package. More particularly, the present invention relates to an apparatus for and to a method of detaching a semiconductor chip from a tape.

2. Description of the Related Art

Semiconductor chips are assembled into packages, which protect the chips and allow the chips to be integrated into electronic devices. The semiconductor chips are initially formed together on a substrate. Thus, the assembly process entails separating the semiconductor chips from one another. For example, a tape is attached to the semiconductor substrate, the substrate is cut to separate the semiconductor chips, and the semiconductor chips are then detached from the tape. The semiconductor chips may be then transferred to and mounted on base frames of the semiconductor packages.

Apparatuses for detaching semiconductor chips from a tape are disclosed in Japanese Patent Publication Number 2003-124290 and U.S. Patent Publication Number 2005-274457. The disclosed apparatuses use pins for detaching the semiconductor chips from a tape. However, semiconductor chips can be damaged due to stress concentrations caused by the pins. In particular, today's highly integrated semiconductor devices are very thin. Therefore, semiconductor chips can be easily cracked by a pin.

In another method, the tape attached to a semiconductor chip is held in place using suction. The suction also serves to pull the tape away from the semiconductor chip. Then the semiconductor chip is detached from the tape using a collet that grasps the chip from above. However, various types of errors frequently occur in this process. Such errors can only be minimized by employing expensive and highly specialized detaching apparatus.

SUMMARY OF THE INVENTION

An object of the present invention is to provide an apparatus that can detach a semiconductor chip from a tape without cracking the semiconductor chip.

Likewise, another object of the present invention is to provide a method of detaching a semiconductor chip from a tape without cracking the semiconductor chip.

Another object of the present invention is to provide an error-free method of separating semiconductor chips from a tape and transferring the chips for assembly into semiconductor device packages.

According to one aspect of the present invention, there is provided an apparatus for detaching a semiconductor chip from a tape, which includes a holder, and first and second ejectors disposed in the holder. The holder has an upper portion and a through-hole extending through the upper portion. A tape to which a semiconductor chip is attached is placed against the upper portion of the holder with the chip disposed over the through-hole. The first ejector is slidable longitudinally relative to the holder such that an end of the first ejector can be extended out of the through-hole to push the semiconductor chip off of the holder. The second ejector is also slidable longitudinally relative to the holder.

According to another aspect of the present invention, an end of the second ejector is supported so that it can be extended out of the through-hole further than that of the first ejector to push the semiconductor chip further away from the holder. Accordingly, the tape and the semiconductor chip can be progressively detached from one another.

According to another aspect of the present invention, the end of the first ejector defines a vacuum channel open at the top of the first ejector so that the tape can be held against the end of the first ejector using suction. Accordingly, the suction may be used to partially detach the tape from the chip before the ends of the ejectors are extended from the holder.

Also, according to the present invention, the second ejector may have a vacuum channel open at the end thereof so that the tape can be held against the end of the second ejector using suction. The vacuum channel of the first ejector and the vacuum channel of the second ejector may be in communication with each other when the first and second ejectors are at home positions at which the ends of the ejectors are situated in the through-hole in the upper portion of the holder. The holder may also have a vacuum channel in the upper portion thereof so that a portion of the tape surrounding the chip can be held against the upper portion of the holder by suction.

An actuator for moving the ejectors may include a shaft to which the first and second ejectors are both coupled. The actuator may also include a support member fixed to the shaft. The support member may be disposed inside the first ejector. An elastic member may be interposed between the support member and the first ejector so that the first ejector is supported by the support member via the elastic member.

According to still another aspect of the present invention, there is provided a method of detaching a semiconductor chip from a tape, which includes placing the tape against a holder with the semiconductor chip facing away from the holder; and then progressively detaching the tape from the chip.

In one respect, the semiconductor chip is moved off of the holder using first and second ejectors in sequence. Initially, at least the first ejector is extended from the holder against a portion of the tape to which the semiconductor chip is directly attached. Also, at this time, a portion of the tape surrounding the semiconductor chip is held against the holder. As a result, a portion of the tape is detached from the chip. Next, the semiconductor chip is moved further away from the holder by extending a second ejector out of the holder beyond the first ejector and against a portion of the tape to which the semiconductor chip is directly attached. At this time, the portion of the tape surrounding the semiconductor chip remains held against the holder. As a result, the tape is further detached from the chip. The semiconductor chip is then completely separated from the tape while the chip is held. In this respect, the semiconductor chip may be held by a collet, and the collet can be moved away from the holder and/or the second ejector can be retracted back into the holder.

In another respect, the semiconductor chip is first moved off of the holder by exerting a force on the semiconductor chip across a relatively large first region thereof, while holding a portion of the tape surrounding the semiconductor chip against the holder. As a result, a portion of the tape is detached from the chip without concentrating stress on the chip. Subsequently, the semiconductor chip is moved further off of the holder by exerting a force on the semiconductor chip across only a second region thereof smaller than the first region, while continuing to hold the portion of the tape surrounding the semiconductor chip against the holder. Thus, chip can be detached almost completely from the tape but stress exerted on the chip at this time is minimal because a significant portion of the tape has already been detached from the chip.

BRIEF DESCRIPTION OF THE DRAWINGS

The above and other objects, features and advantages of the present invention will become more apparent from the following detailed description of the preferred embodiments thereof made with reference to the attached drawings in which.

DETAILED DESCRIPTION OF THE PREFERRED EMBODIMENTS

Figure 1:
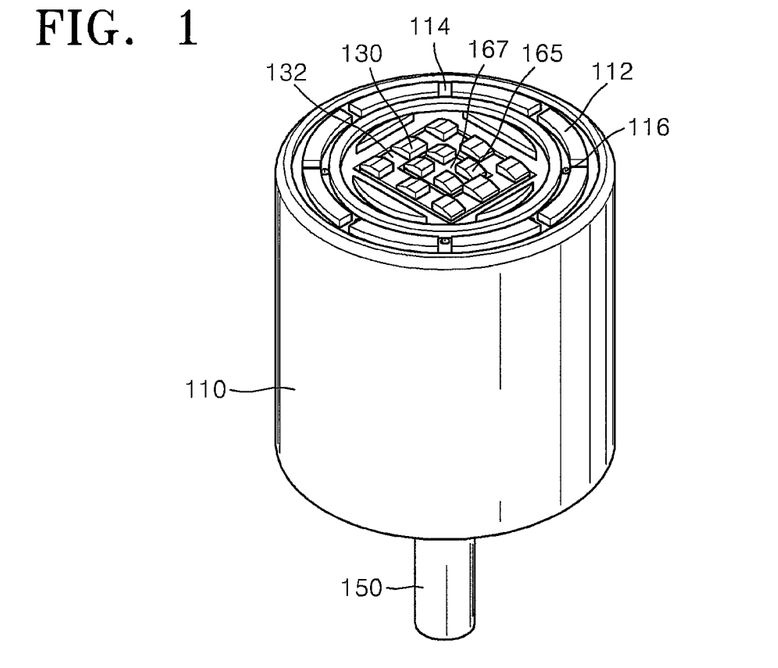
FIG. 1 is a perspective view of a first embodiment of an apparatus for detaching a semiconductor chip from a tape according to the present invention.
Figure 2:
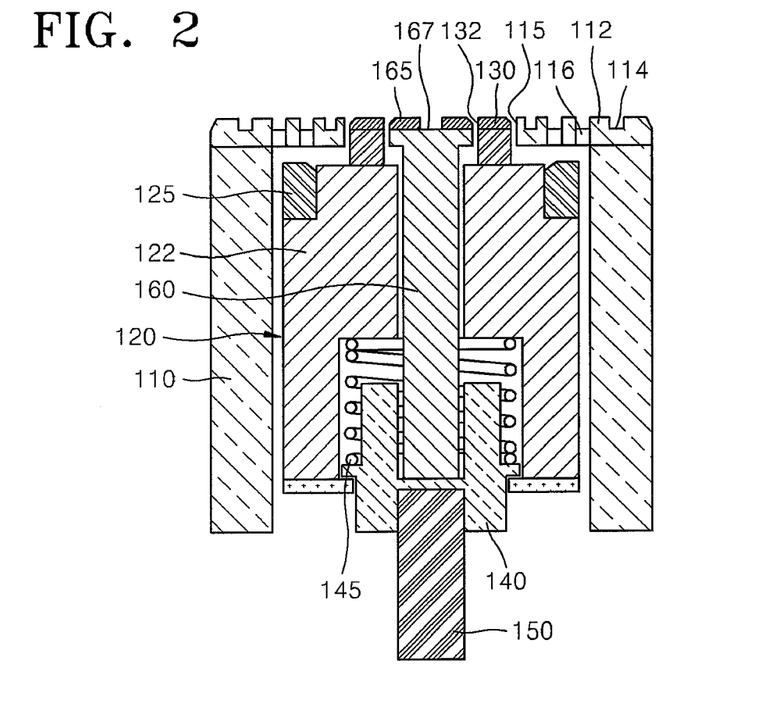
FIG. 2 is a sectional view of the apparatus depicted in FIG. 1.

Referring to FIGS. 1 and 2, a semiconductor chip detaching apparatus includes a holder 110 and a pair of ejectors, namely a first ejector 120 and a second ejector 160. The holder 110 has an upper portion 112 that receives at least one semiconductor chip attached to a tape (not shown). A through-hole 115 extends through the center of the upper portion 112 of the holder 110. The upper portion 112 of the holder 110 may be circular, and the shape of the cross section of the through-hole 115 may correspond to that of a semiconductor chip, e.g., may be rectangular. Also, the holder 110 is hollow and the first and second ejectors 120 and 160 are received in the holder 110. More specifically, the first and second ejectors 120 and 160 are supported so as to be slidable relative to the holder 110. In this way, the first and second ejectors 120 and 160 can be extended through the through-hole 115 to push up at least one semiconductor chip received on the upper portion 112 of the holder, and can subsequently be retracted back to their original positions inside the holder 110.

A vacuum pump (not shown) can be connected to the holder 110 to reduce the pressure inside the holder 110. Furthermore, a vacuum channel 114 extends in an upper portion 112 of the holder 110, and the upper portion 112 of the holder 110 has through-holes 116 open to the vacuum channel 114 and the inside of the holder 110. Thus, the through-holes 116 place the vacuum channel 114 in communication with the space inside the holder 110. Accordingly, a vacuum can be created in the vacuum channel 114 by the vacuum pump attached to the holder 110 so that a tape can be held by suction to the upper portion 112 of the holder 110. Alternatively, other means may be used to hold the tape to the upper portion 112 of the holder 110. For example, the upper portion 112 of the holder 110 can be formed of a porous membrane through which a vacuum created inside the holder 110 can be exerted on a tape that rests on the upper portion 112 of the holder 110.

The first ejector 120 includes a body 122 and a plurality of first tabs 130 disposed on an upper end of the body 122. The cross section of the body 122 is larger than that of the through-hole 115 but smaller than that of the space inside the holder 110 so that the body 122 is confined within the holder 110 but can slide longitudinally relative to the holder 110. The first tabs 130 protrude from the body 122 and are located such that the first tabs 130 can slide through the through-hole 115 when the body 122 is moved. For example the tabs 130 may be spaced from one another along the periphery of a rectangle inscribed by the through-hole 115. The first tabs 130 may also define a vacuum channel 132 therebetween. The vacuum channel 132 is open to the space inside the holder 110 so that a tape can be held to the first tabs 130 by a vacuum created inside the holder 110.

The body 122 of the first ejector 120 also includes a stop 125 that engages the holder 110 when the first ejector 120 is raised relative to the holder 110. More specifically, the stop 125 of the body 122 of the first ejector 120 contacts the upper portion 112 of the holder 110 when the first ejector 120 is raised. At this time, the first tabs 130 protrude above the upper portion 112 of the holder 110 so that a semiconductor chip can be pushed upward, as will be described in more detail later on.

The second ejector 160 is disposed inside the first ejector 120 and is supported so as to be slidable longitudinally relative to the first ejector 120. The second ejector 160 has a main body, and a plurality of second tabs 165 at an upper end of the main body. The second tabs 165 protrude from the main body of the second ejector 160 such that the second tabs 165 can slide through the through-hole 115 when the main body is moved. Also, the second tabs 165 are spaced from one another to define a vacuum channel 167 therebetween. The vacuum channel 167 is open to the space inside the holder 110 so that a tape can be held to the second tabs 165 by a vacuum created inside the holder 110. The second tabs 165 may lie along a rectangle concentric with the rectangle along which the first tabs 130 are disposed. The vacuum channels 132, 167, and 114 of the first ejector 120, the second ejector 160, and the holder 110 are in communication with each other at the upper portion 112 of the holder 110. Thus, suction can be created in all of the vacuum channels 132, 167, and 114 via the through-holes 116 which open to the space inside the holder, i.e., the space in which a vacuum is created by a vacuum pump. Alternatively, one or two of the vacuum channels 132, 167, and 114 may be isolated from the other or other vacuum channels and connected to respective vacuum lines so that different vacuum levels can be created in the vacuum channels 132, 167, and 114. For example, the vacuum channels 132 and 167 of the first and second ejectors 120 and 160 can be in communication with each other but isolated from the vacuum channel 114 of the holder 110. In this case, a separate vacuum line is connected to the vacuum channels 132 and 167 so that suction can be created in the vacuum channels 132 and 167 independently of the vacuum channel 114. In addition, the upper portion 112 of the holder 110 may comprise a mechanical chuck or an electrostatic chuck instead of the vacuum chuck constituted by the vacuum channel 114 and through-holes 116.

The semiconductor chip detaching apparatus also includes at least one actuator for moving the first and second ejectors 120 and 160 linearly within the holder 110. The actuator may comprise a shaft 150, and a support member 140 fixed to the shaft 150 and supporting the first and second ejectors 120 and 160. For example, the support member 140 can be disposed inside the first ejector 120, an elastic member such as a spring 145 may be interposed between the support member 140 and the body 122 of the first ejector, and the second ejector 160 can be fixed to the support member 140 by a magnetic force. That is, the support member 140 and the main body of the second ejector 160 may comprise magnets oriented such that the second ejector 160 and the support member 140 remain fixed relative to one another by a magnetic force of attraction. The shaft 150 can be part of or connected to a motor that is operative to reciprocate the shaft 150.

The operation of the actuator of the semiconductor chip detaching apparatus depicted in FIG. 1 will now be described in more detail with reference to FIGS. 3 and 4.

Figure 3:
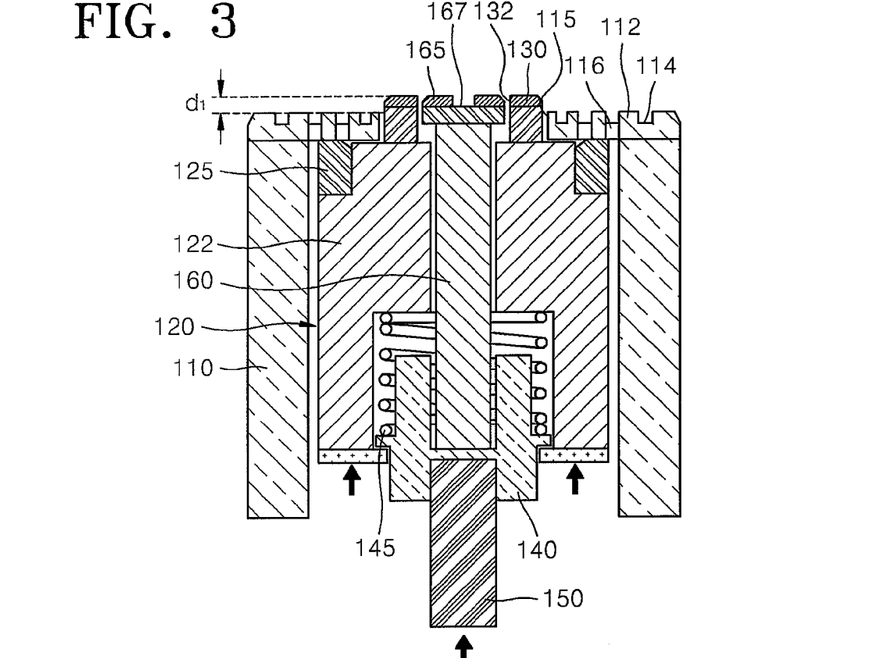
FIGS. 3 and 4 are also each a sectional view of the apparatus depicted in FIG. 1 and together illustrate an operation of the apparatus.

FIG. 3 illustrates a first lifting stage of the operation of the semiconductor chip detaching apparatus. In this stage, the shaft 150 is driven upward to raise the support member 140. As a result, both the first and second ejectors 120 and 160 are raised from their home positions until the stop 125 of the first ejector 120 contacts the upper portion 112 of the holder 110. That is, the first ejector 120 is stopped at its ejection position. During this movement, the spring 145 supports the body 122 of the first ejector 120 while exerting a constant force on the body, i.e., the spring 145 is not deflected. Also, the distance $d_1$ between the uppermost surface of the first ejector 120 and the upper portion 112 of the holder 110 is equal to the distance traveled by the stop 125 of the first ejector 120.

Figure 4:
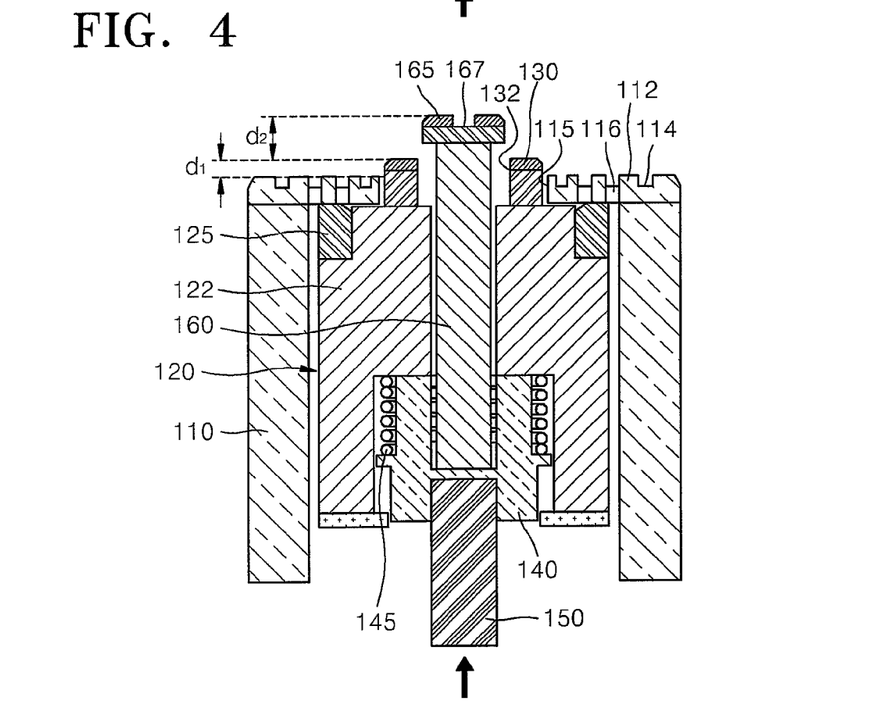

FIG. 4 illustrates a second lifting stage of the operation of the semiconductor chip detaching apparatus. In this stage, the shaft 150 is driven further upwardly to further raise the support member 140. As a result, the spring 145 is compressed and the second ejector 160 is raised by an additional distance $d_2$ to its ejection position. In this case, the first ejector 120 remains in place because the first ejector 120 is disposed up against the upper portion 112 of the holder 110. The second ejector 160 is positioned according to the force applied to the shaft 150 and the elasticity of the spring 145.

As described above, the first and second ejectors 120 and 160 are moved using a common shaft, namely shaft 150. Thus, the semiconductor chip detaching apparatus has a simple structure and is energy-efficient.

Furthermore, the semiconductor chip detaching apparatus may also include a collet 70 (refer to FIG. 8) for holding a semiconductor chip and for removing the semiconductor chip from a tape. Such a collet is known, per se, in the art. For example, the collet may comprise a vacuum chuck by which a chip can be held by suction and the collet is movable in a vertical direction to remove the chip from the tape.

Figure 5:
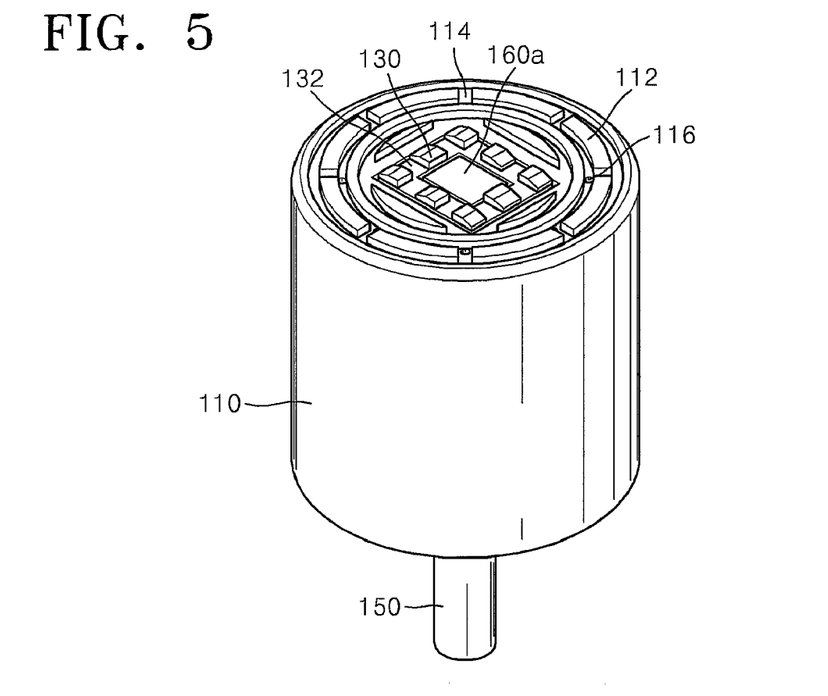
FIG. 5 is a perspective view of another embodiment of an apparatus for detaching a semiconductor chip from a tape according to the present invention.
Figure 6:
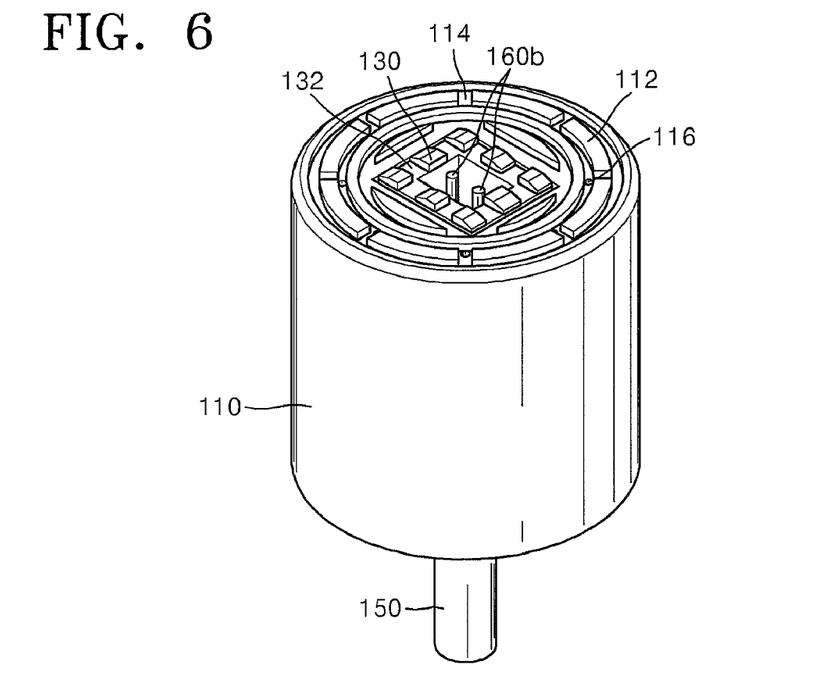
FIG. 6 is a perspective view of still another embodiment of an apparatus for detaching a semiconductor chip from a tape according to the present invention.
Figure 7:
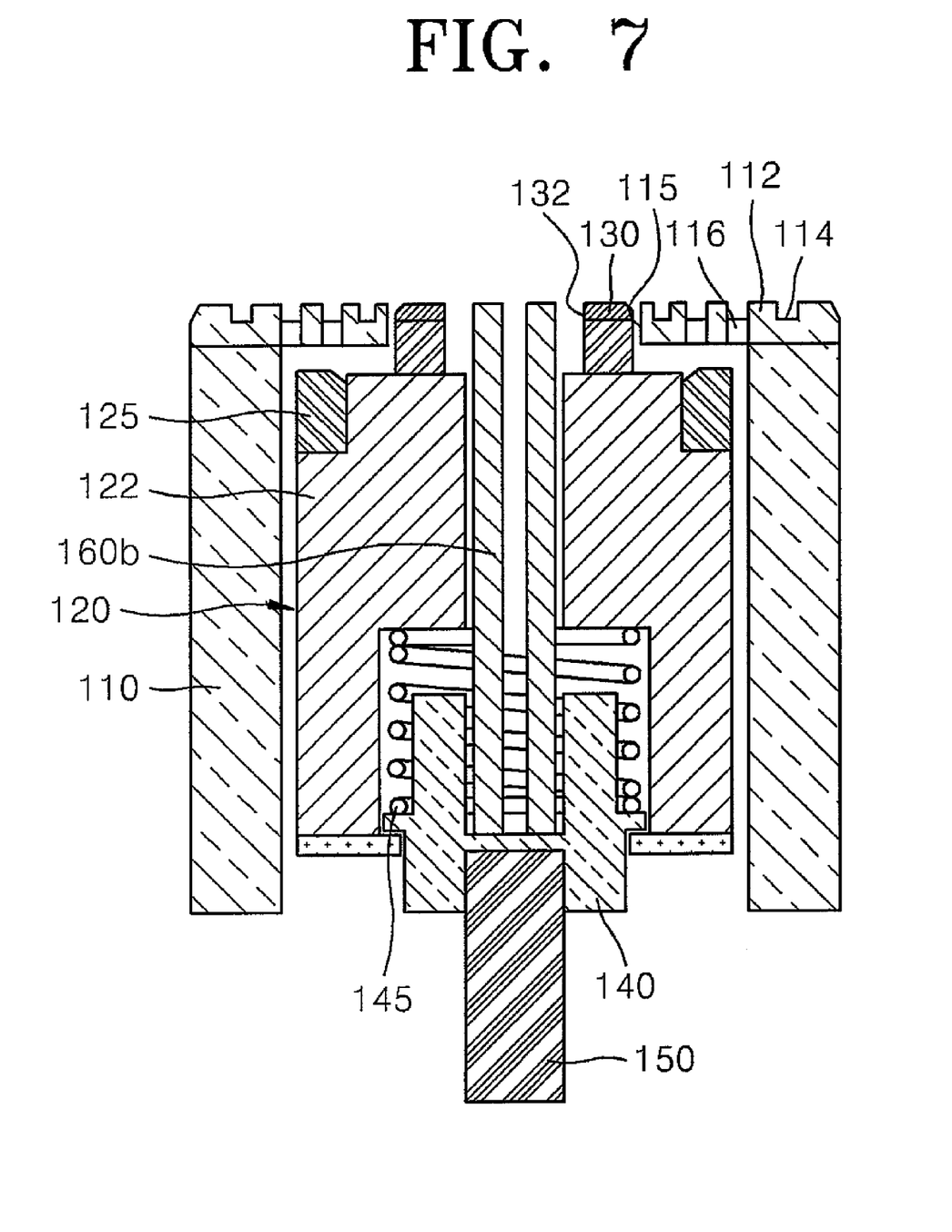
FIG. 7 is a sectional view of the apparatus depicted in FIG. 6.

FIGS. 5 and 6, 7 illustrate other embodiments of apparatuses for detaching a semiconductor chip from a tape according to the present invention. The embodiments of FIGS. 5 and 6, 7 are similar to the embodiment illustrated in FIGS. 2 and 3, except for the second ejector. Therefore, elements of these embodiments which are similar to those of the first embodiment are denoted by like reference numerals and a detailed description thereof will be omitted.

Referring to FIG. 5, the second ejector 160a has a blunt upper end that can be extended above the upper portion 112 of the holder 110 when the second ejector 160a is raised. The blunt upper end of the second ejector 160a has a flat surface, i.e., does not define a vacuum channel. Therefore, a tape is held by suction created in the vacuum channel 132 of the first ejector 120 and in the vacuum channel 116 of the holder 110.

Referring to FIGS. 6 and 7, the second ejector 160b includes a pair of pins. The pins can be fixed to the support member 140 by a magnetic force. The pins minimize the area of contact between the second ejector 160b and the tape. Therefore, this embodiment is highly effective in detaching a semiconductor chip from the tape.

FIGS. 8 through 12 illustrate a method of detaching a semiconductor chip from a tape according to the present invention. The method will be described using the apparatus illustrated in FIGS. 1-4 as an example. However, it will be apparent that the method can be similarly executed using either of the apparatuses illustrated in FIGS. 5 through 7.

Figure 8:
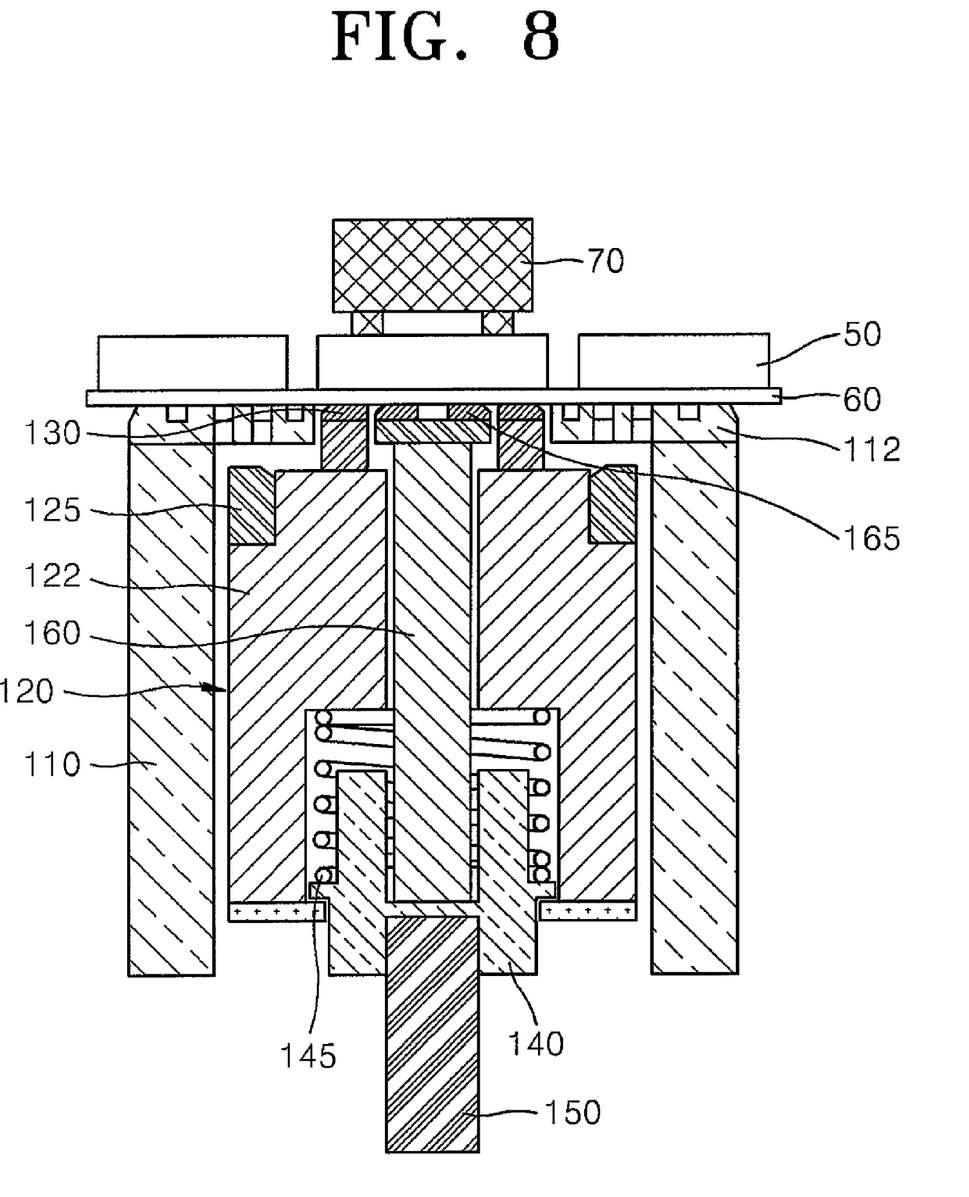
FIGS. 8 through 12 are each a sectional view of the apparatus depicted in FIGS. 1-4 and together illustrate a method of detaching a semiconductor chip from a tape according to an embodiment of the present invention.

Referring to FIG. 8, one or more semiconductor chips 50 (three are shown) attached to a tape 60 are provided. For example, the semiconductor chips 50 are formed on a semiconductor substrate. Then, the tape 60 is attached to the semiconductor substrate. Next, the semiconductor substrate is cut to separate the semiconductor chips 50 from one another. At this time, the semiconductor chips 50 remain attached to the tape 60. The tape 60 bearing the semiconductor chips 50 is then placed on the upper portion 112 of the holder 110 with one of the chips 50 disposed over the first and second ejectors 120 and 160.

Next, the semiconductor chip 50, which is disposed over the first and second ejectors 120 and 160, is held in place by the collet 70. In this respect, the collet 70 can exert suction on the semiconductor chip. However, the use of the collet 70 can be omitted during this stage of the method according to the present invention.

Figure 9:
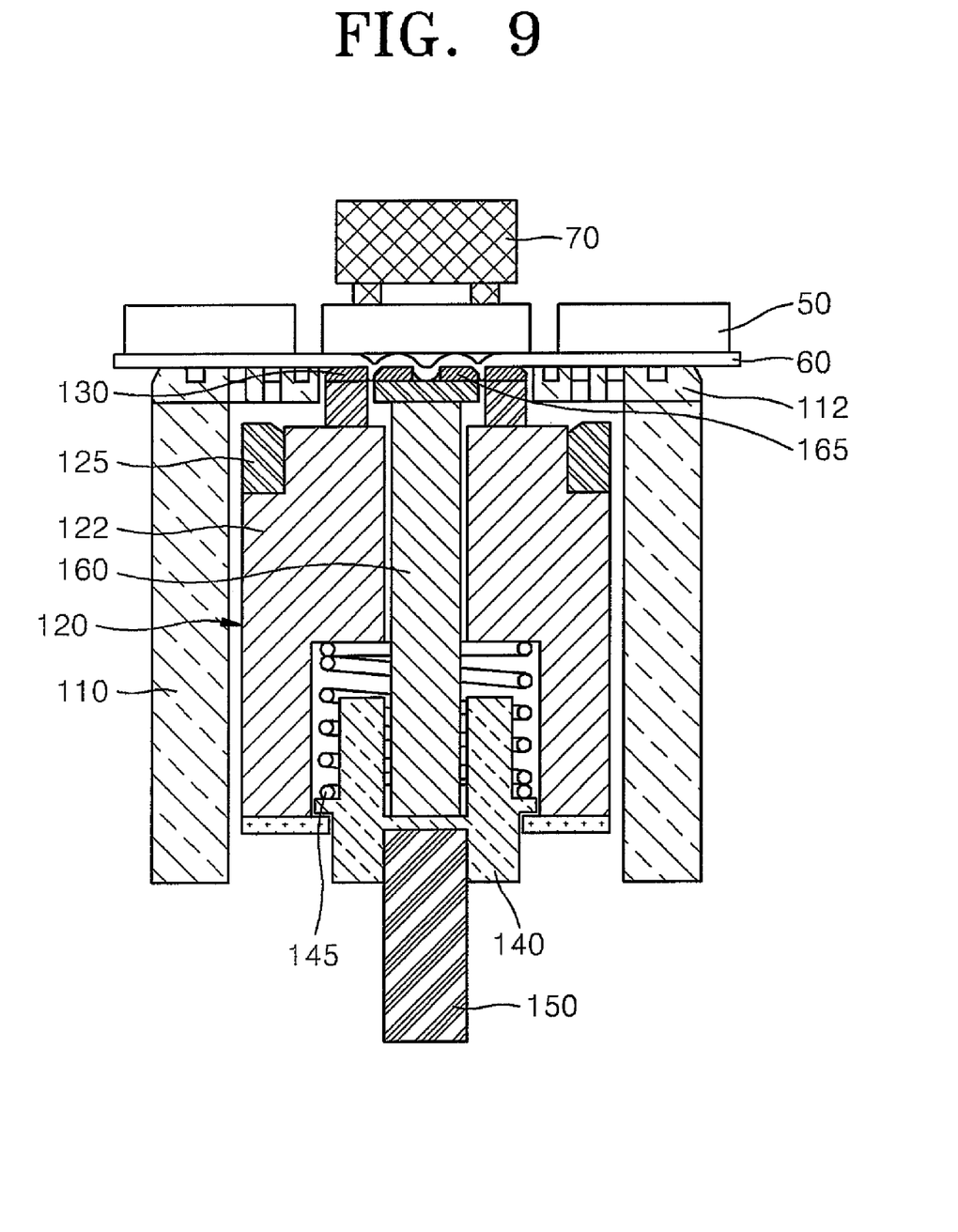

Referring to FIG. 9, the tape 60 is partially detached from the semiconductor chip 50 by exerting suction on the tape at the side thereof opposite the chip 50. More specifically, a vacuum pump attached to the holder 110 is operated to evacuate the inside of the holder 110. The vacuum thus created acts on the underside of the tape 60 through the through-holes 116 and the vacuum channels 114, 132 and 167 which are in communication with each other at the upper portion 112 of the holder 110. Thus, the suction created in the vacuum channel 114 of the holder 110 fixes the tape 60 to the upper portion 112 of the holder 110. Furthermore, a relatively large region of the tape 60 is detached from the semiconductor chip 50 by the suction created in the vacuum channels 132, 167. However, as was mentioned previously, the vacuum channel 114 can be isolated from the vacuum channels 132 and 167 at the upper portion 112 of the holder. In this case, the level of suction created in the vacuum channel 114 and the level of suction created in the vacuum channels 132 and 167 can be set independently to ensure that only portions of the tape 60 which lie over the vacuum channels 132 and 167 detach from the chip 50.

Figure 10:
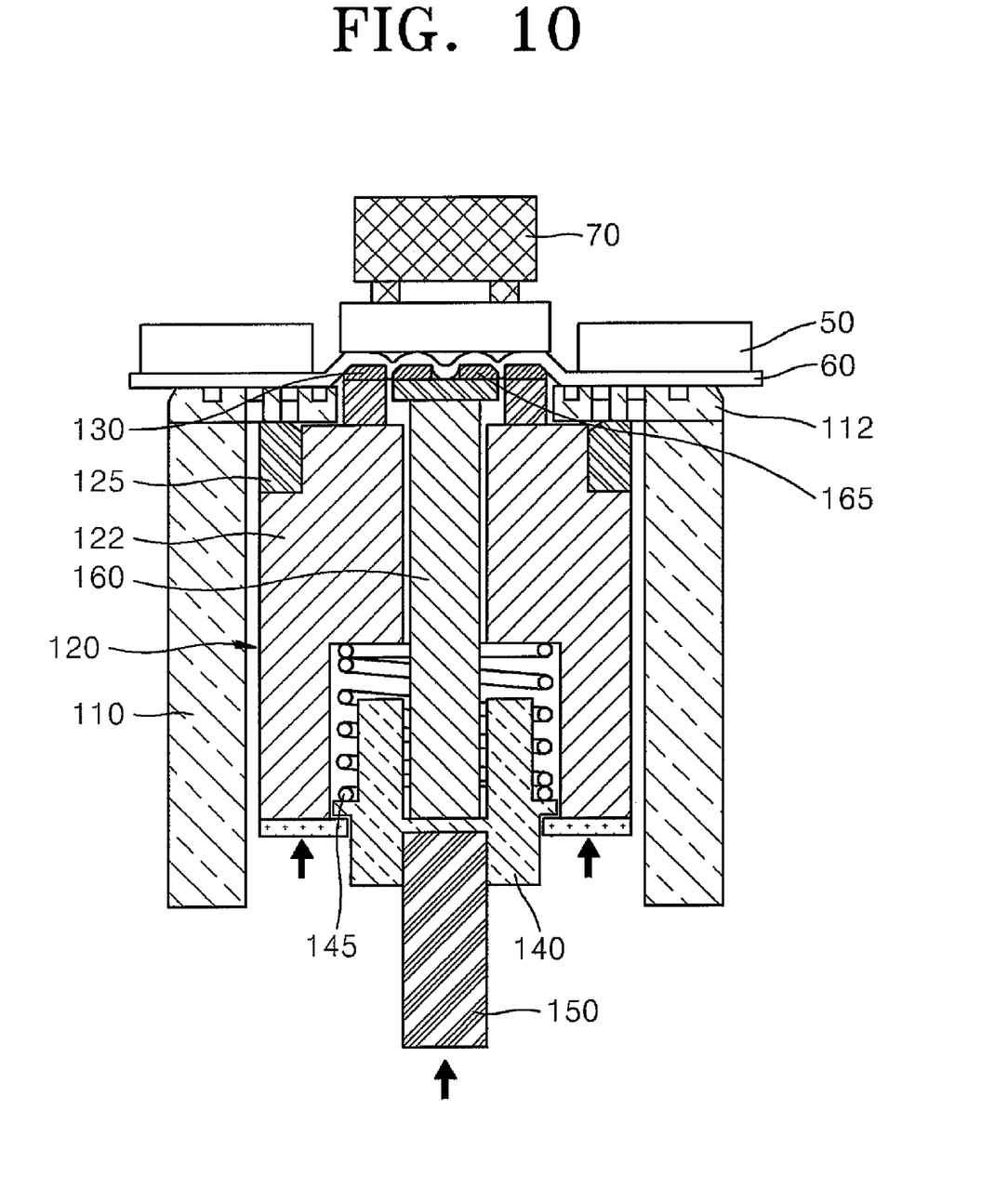

Referring to FIG. 10, the semiconductor chip 50 is raised above the holder 110 an initial distance ($d_1$ in FIG. 3) by the first and second ejectors 120 and 160. Alternatively, the semiconductor chip 50 can be initially raised above the holder 110 by only the first ejector 120. Even in this case in which only the peripheral portion of the chip 50 is supported, the chip 50 is less likely to crack as the tape 60 is pulled away than if a pin alone, as in the prior art, were being used to raise the chip 50. Also, during this stage of the operation, the portion of the tape 60 that surrounds the semiconductor chip 50 is or remains fixed to the holder 110. That is, the first ejector 120 or both the first and second ejectors 120 and 160 is/are raised while suction is created in the vacuum channel 114 of the holder 110 such that the portion of the tape 60 overlying the vacuum channel 114 is held against the upper portion 112 of the holder 110. Alternatively, the tape 60 can be mechanically or electrostatically fixed to the upper portion 112 of the holder 110. As a result, the tape 60 is detached from at least along the periphery of the semiconductor chip 50.

Figure 11:
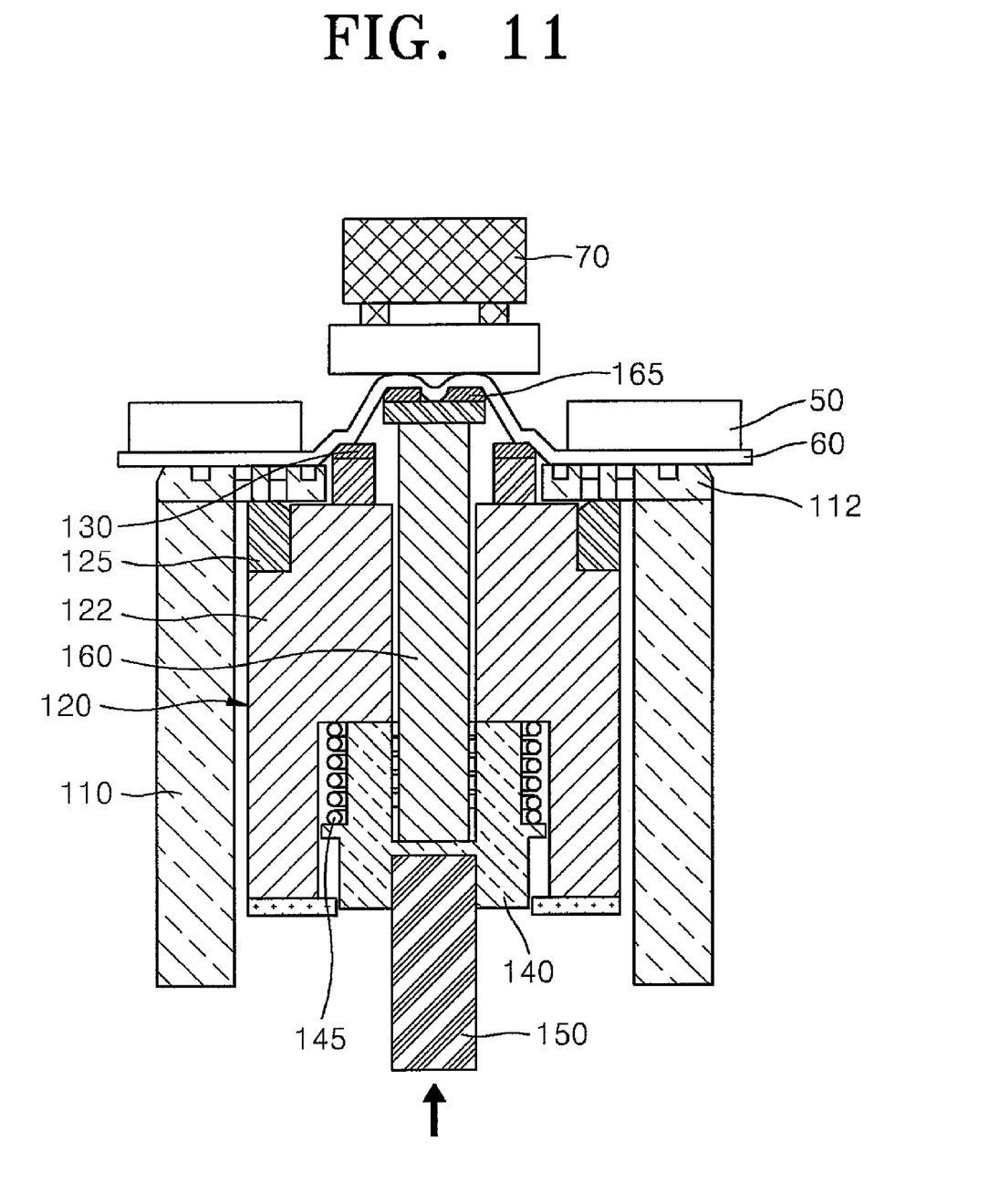

Referring to FIG. 11, the semiconductor chip 50 is further raised above the holder 110 a second distance ($d_2$ in FIG. 4) by the second ejector 160. As a result, the tape 60 is further detached from the semiconductor chip 50. At this time, only portions of the tape 60 supported by the second tabs 165 of the second ejector 160 remain attached to the semiconductor chip 50. Also, the semiconductor chip 50 is not likely to crack because (1) a relatively large region of the semiconductor chip 50 is supported as the semiconductor chip is initially raised to detach the chip 50 from the tape 60, (2) the second lifting operation performed by the second ejector 160 over a relatively small region of the semiconductor chip 50 is carried out once the tape 60 has already been partially detached from the chip 50, and (3) the semiconductor chip 50 is decelerated by the spring 145 during the second lifting operation performed by the second ejector 160.

Figure 12:
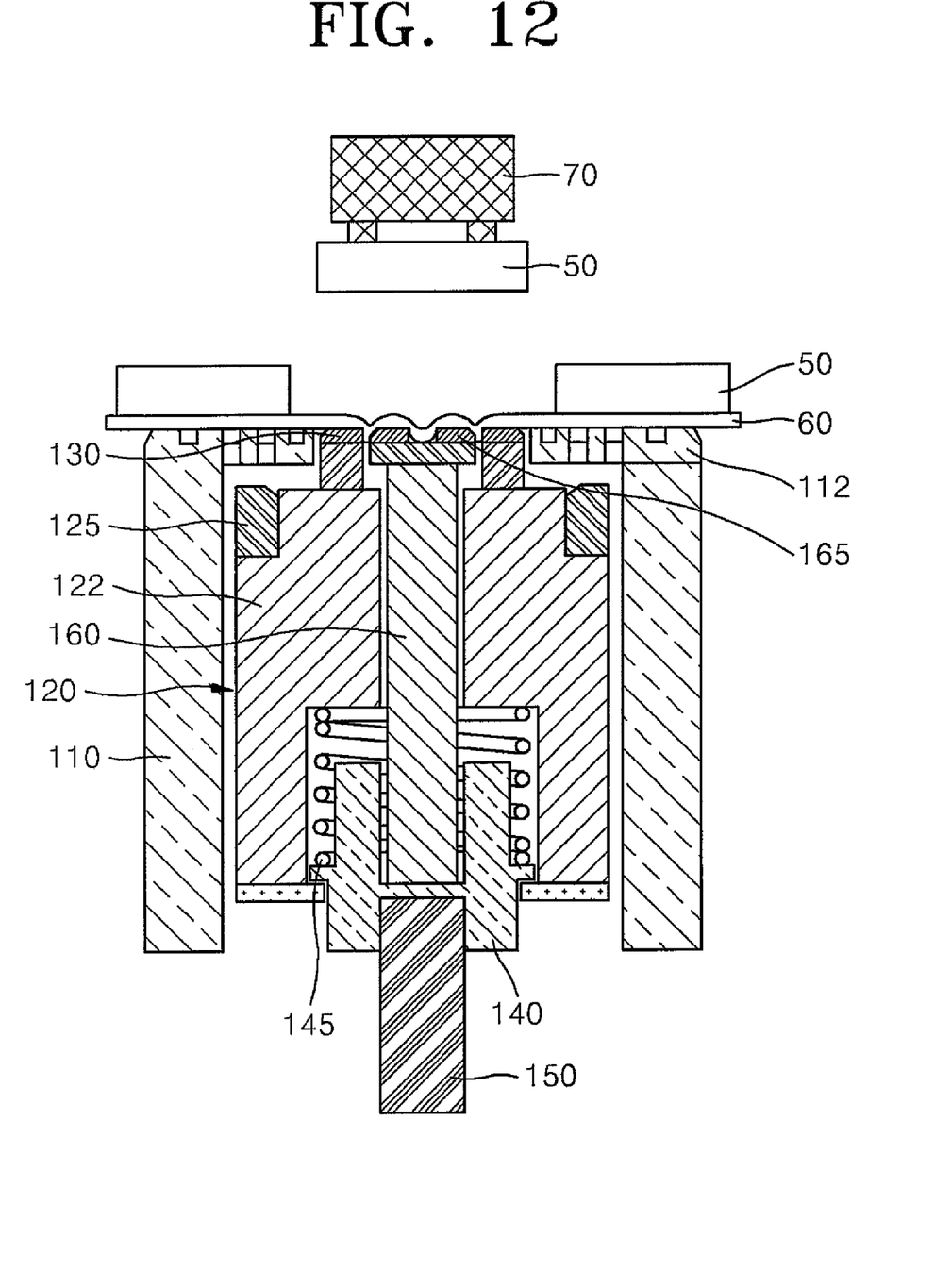

Referring to FIG. 12, the first and second ejectors 120 and 160 are retracted back into the holder 110 while the semiconductor chip 50 is held. For example, the semiconductor chip 50 can be held by suction by the collet 70. At this time, the collet 70 can remain stationary or can be raised while holding the semiconductor chip 50. In either case, the semiconductor chip 50 is completely detached from the tape 60.

As described above, the semiconductor chip 50 is detached from the tape 60 in basically three stages. That is, in the first stage, the semiconductor chip 50 is partially detached from the tape 60 using suction created in the vacuum channels 132 and 167 of the first and second ejectors 120 and 160 (FIG. 9). In the second stage, the semiconductor chip 50 is lifted an initial amount while the portion of the tape 60 surrounding the chip 50 is held down to detach the tape 60 from the periphery of the semiconductor chip 50 (FIG. 10). In the third stage, the semiconductor chip 50 is raised an additional amount that nearly completes the detachment of the semiconductor chip 50 from the tape 60. This progressive detachment of the semiconductor chip 50 from the tape 60 minimizes the possibility that the semiconductor chip 50 will crack.

Finally, although the present invention has been described in connection with the preferred embodiments thereof, it is to be understood that the scope of the present invention is not so limited. On the contrary, various modifications of and changes to the preferred embodiments will be apparent to those of ordinary skill in the art. For example, the at least one actuator for moving the first and second ejectors 120 and 160 has been described above as including a common shaft, namely shaft 150. However, according to the present invention, the first and second ejectors 120 and 160 can be moved by separate actuators. For example, the support 140 and the spring 145 can be omitted, the second ejector 160 can be connected directly to one shaft, and the first ejector 120 can be connected to another shaft (not shown). The two shafts can be connected to stepper motors (not shown), respectively. Thus, changes to and modifications of the preferred embodiments may fall within the true spirit and scope of the invention as defined by the appended claims.

What is claimed is:

1. An apparatus for detaching a semiconductor chip from a tape, comprising:
a hollow holder having an upper portion and a through-hole extending through the upper portion;
a first ejector disposed within the holder and supported so as to be slidable longitudinally relative to the holder between a first home position and first ejection position, the first ejector having an upper end that is situated in the through-hole of the upper portion of the holder when the first ejector is at the first home position thereof and that protrudes a first distance above the upper portion of the holder when the first ejector is at the first ejection position thereof, whereby the first ejector can push a semiconductor chip attached to a tape resting on the upper portion of the holder upward; and
a second ejector disposed within the first ejector and supported so as to be slidable longitudinally relative to the holder between a second home position and a second ejection position, the second ejector having an upper end that is situated in the through-hole of the upper portion of the holder when the second ejector is at the second home position thereof and that protrudes a second distance above the upper portion of the holder when the second ejector is at the second ejection position, the second distance being greater than the first distance, whereby the second ejector can push the semiconductor chip attached to the tape further away from the holder than the first ejector,
wherein the first ejector and the second ejector are elastically coupled each other such that the first ejector and the second ejector move simultaneously relative to the holder as the first ejector moves from the first home position to the first ejection position.

2. The apparatus of claim 1, further comprising a shaft to which both the first and second ejectors are coupled, the shaft being supported so as to be slidable longitudinally relative to the holder to move the first and second ejectors.

3. The apparatus of claim 2, wherein the first ejector comprises a body having a cross section larger than that of the through-hole in the upper portion of the holder so that the body is confined within the holder, and the upper end of the first ejector comprises a plurality of upwardly protruding tabs.

4. The apparatus of claim 2, further comprising a support member fixed to the shaft and supporting the second ejector.

5. The apparatus of claim 4, further comprising an elastic member interposed between the support member and the first ejector such that the support member supports the first ejector via the elastic member.

6. The apparatus of claim 1, wherein the upper end of the first ejector has a vacuum channel extending therein and open at the top of the first ejector.

7. The apparatus of claim 6, wherein the upper end of the second ejector has a vacuum channel extending therein and open at the top of the second ejector.

8. The apparatus of claim 7, wherein the vacuum channels of the first and second ejectors are in communication with each other when the first and second ejectors are at the respective first and second home positions thereof.

9. The apparatus of claim 7, wherein the upper portion of the holder has a vacuum channel extending therein and open at the top of the holder.

10. The apparatus of claim 6, wherein the second ejector comprises at least one pin.

11. The apparatus of claim 6, wherein the cross section of the through-hole in the upper portion of the holder has the shape of a solid rectangle.

12. The apparatus of claim 11, wherein the cross section of the upper end of the first ejector has the shape of a hollow rectangle, and the upper end of the second ejector is disposed within the upper end of the first ejector when the first and second ejectors are at the home positions thereof.

13. An apparatus for detaching a semiconductor chip, comprising:
a holder having an upper portion and a through-hole extending through the upper portion;
a first ejector disposed within the holder and supported so as to be slidable longitudinally relative to the holder between a first home position and a first ejection position, the first ejector having an upper end that is situated in the through-hole of the upper portion of the holder when the first ejector is at the first home position thereof and that protrudes above the upper portion of the holder when the first ejector is at the first ejection position thereof, whereby the first ejector can push a semiconductor chip attached to a tape resting on the upper portion of the holder upward, the upper end having a vacuum channel therein open at the top of the first ejector; and a second ejector disposed within the first ejector and supported so as to be slidable longitudinally relative to the holder between a second home position and a second ejection position, the second ejector having an upper end that is disposed centrally of the upper end of the first ejector, and the second ejector having an upper end that is situated in the through-hole of the upper portion of the holder when the second ejector is at the second home position thereof and that protrudes above the upper portion of the holder when the second ejector is at the second ejection positions, wherein the first ejector and the second ejector are elastically coupled each other such that the first ejector and the second ejector move simultaneously relative to the holder as the first ejector moves from the first home position to the first ejection position.

14. The apparatus of claim 13, wherein the upper end of the second ejector has a vacuum channel extending therein and open at the top of the second ejector.

15. The apparatus of claim 14, wherein the upper portion of the holder has a vacuum channel extending therein and open at the top of the holder.

16. The apparatus of claim 13, further comprising a shaft to which both the first and second ejectors are coupled, the shaft being supported so as to be slidable longitudinally relative to the holder to move the first and second ejectors.

17. The apparatus of claim 16, further comprising a support member fixed to the shaft and supporting the second ejector, and an elastic member interposed between the support member and the first ejector such that the support member supports the first ejector via the elastic member.

18. The apparatus of claim 13, wherein the first ejector has a plurality of upwardly protruding tabs at the end thereof, the tabs being spaced apart and defining the vacuum channel in the upper end of the first ejector.

* * * * *